(12) United States Patent
Johansson

(10) Patent No.: US 7,978,104 B2
(45) Date of Patent: Jul. 12, 2011

(54) COMPENSATION OF MISMATCH ERRORS IN A TIME-INTERLEAVED ANALOG-TO-DIGITAL CONVERTER

(75) Inventor: Håkan Johansson, La Jolla, CA (US)

(73) Assignee: Signal Processing Devices Sweden AB, Linköping (SE)

(*) Notice: Subject to any disclaimer, the term of this patent is extended or adjusted under 35 U.S.C. 154(b) by 14 days.

(21) Appl. No.: 12/665,466

(22) PCT Filed: Jun. 21, 2007

(86) PCT No.: PCT/SE2007/050456
§ 371 (c)(1),
(2), (4) Date: Dec. 18, 2009

(87) PCT Pub. No.: WO2008/156401
PCT Pub. Date: Dec. 24, 2008

(65) Prior Publication Data
US 2010/0192027 A1    Jul. 29, 2010

(51) Int. Cl.
*H03M 1/12* (2006.01)
(52) U.S. Cl. .................... 341/120; 341/155
(58) Field of Classification Search .............. 341/120, 341/155
See application file for complete search history.

(56) References Cited

U.S. PATENT DOCUMENTS

| 5,239,299 | A | * | 8/1993 | Apple et al. ............. 341/155 |
| 7,049,992 | B1 | | 5/2006 | Hilton |
| 2004/0174284 | A1 | | 9/2004 | Pupalaikis |
| 2005/0120068 | A1 | * | 6/2005 | Sato ...................... 708/446 |
| 2006/0279445 | A1 | | 12/2006 | Kinyua et al. |
| 2007/0069937 | A1 | | 3/2007 | Balakrishnan et al. |

OTHER PUBLICATIONS

Rabiner, L. R. et al.; On the Behavior of Minimax Relative Error FIR Digital Differentiators, 1974 American Telephone and Telegraph Co., The Bell System Technical Journal, vol. 53, No. 2, Feb. 1974, pp. 333-361.*

Hummels, D.M. et al.; Distortion Compensation for Time-Interleaved Analog to Digital Converters; IEEE Instrumentation and Measurement Technology Conference, Brussels, Belgium, Jun. 4-6, 1996, pp. 728-731.*

Stefan Mendel, et al., "A Compensation Method for Magnitude Response Mismatches in Two-channel Time-interleaved Analog-to-Digital Converters," Proc. IEEE Int. Conf. Electronics, Circuits, Syst., Nice, France, Dec. 2006, pp. 712-715.

Tsung-Heng TSAI, et al., "Bandwidth Mismatch and Its Correction in Time-Interleaved Analog-to-Digital Converters," *IEEE Transactions on Circuits and Systems—II: Express Brief*, vol. 53, No. 10, pp. 1133-1137, Oct. 2006.

(Continued)

*Primary Examiner* — Howard Williams
(74) *Attorney, Agent, or Firm* — Venable LLP; Eric J. Franklin

(57) ABSTRACT

A method for the compensation of frequency-response mismatch errors in M-channel time-interleaved ADCs. The compensation is done utilizing a technique that makes use of a number of fixed filters, that approximate differentiators of different orders, and a few variable multipliers that directly correspond to parameters in polynomial models of the M channel frequency responses. A compensated M-channel time-interleaved ADC is based on and can perform the method.

9 Claims, 2 Drawing Sheets

OTHER PUBLICATIONS

Stefan Mendel et al., On the Compensation of Magnitude Response Mismatches in M-channel Time-Interleaved ADCs, In Proc. IEEE Int. Symp. Circuits, Syst., New Orleans, May 2007, pp. 3375-3378.

Munkyo Seo, et al., Comprehensive Digital Correction of Mismatch Errors for a 400-Msamples/s 80-dB SFDR Time-Interleaved Analog-to-Digital Converter, *IEEE Transactions on Microwave Theory and Techniques*, vol. 53, No. 3, pp. 1072-1082, Mar. 2005.

Seo et al., Generalized Blind Mismatch Correction for Two-Channel Time-Interleaved A-to-D Converters, IEEE Trans. Microwave Theory Techniques, vol. 53, No. 3, pp. 1072-1082, Mar. 2005.

International search report, issued in counterpart application PCT/SE2007/050456, Jun. 12, 2008.

Written opinion of the international searching authority, issued in counterpart application PCT/SE2007/050456, Jun. 12, 2008.

* cited by examiner

COMPENSATION OF MISMATCH ERRORS IN A TIME-INTERLEAVED ANALOG-TO-DIGITAL CONVERTER

CROSS-REFERENCE TO RELATED APPLICATIONS

This application is the national phase under 35 U.S.C. §371 of PCT/SE2007/050456 filed 21 Jun. 2007.

TECHNICAL FIELD

The present invention relates generally to a method and an apparatus for digital signal processing, and more particularly to a method for compensation of frequency response mismatch errors in a time-interleaved Analog-to-Digital converter array and an apparatus performing the method.

BACKGROUND OF THE INVENTION

The shift from analog signal processing (ASP) to digital signal processing (DSP) lies behind the tremendous development of information processing systems that are used today. For example, DSP has enabled the fast growth of mobile communication systems and has opened up for new sophisticated medical aids, just to mention a couple of important applications. The foremost advantages of DSP over ASP are its robustness and that it can perform functions with arbitrary precision. The trend during the past decades has therefore been to use as little ASP as possible and to replace analog functions with the corresponding digital functions. The real world is however analog by nature which means that the need for ASP cannot be eliminated completely. In particular, it will always be necessary to use analog-to-digital converters (ADCs) and digital-to-analog converters (DACs), whenever there is a desire to communicate with other human beings or machines. The present document is concerned with ADCs.

During the past decades, the research and development of ADCs have been quite intensive, both in academia and industry. Nevertheless, it is foreseen that ADCs will remain key components as well as bottlenecks in many contexts of tomorrow. For example, it can be envisaged that an ADC capable of a sampling rate of more than 100 MHz and 17 bits resolution is required in fourth-generation communication systems. This is beyond the state-of-the art ADCs which can manage only some 13-14 effective bits of resolution at this rate. It is therefore vital to continue to invent new ADCs principles, techniques, and architectures to improve the performance of the AD conversion.

ADCs can be categorized into different classes depending on the underlying principle of the conversion process. This paper concerns a principle referred to as time-interleaved ADCs which utilizes interleaving of multiple ADCs to increase the effective sampling rate.

A time-interleaved ADC array is commonly used when a single ADC is not capable of meeting the needed sampling rate while providing desired conversion resolution. A time-interleaved ADC (TI-ADC) array comprises a plurality of ADCs arranged in parallel fashion with a signal to be converted being provided to each ADC of the plurality of ADCs in the array. Each ADC is responsible for converting only a portion of the signal and can therefore perform the conversion at a slower rate. For example, if a TI-ADC array has an integer number of M ADCs arranged in parallel fashion, then each of the M number of ADCs is only required to convert the signal at 1/M-th of the desired sampling rate.

Rather than having a single high conversion rate, high resolution ADC that is capable of converting an analog signal at a sampling rate, $f_s$, the TI-ADC array makes use of M ADCs arranged in parallel configuration. Each of the ADCs has a sampling rate of $f_s/M$. Therefore the sampling rate of the ADCs can be significantly lower than the sampling rate, $f_s$ of the overall TI-ADC array. With the lower sampling rate, cheaper ADCs can be used, ADCs with a higher conversion resolution can be used and the sampling rate of the TI-ADC array can be pushed higher.

Each of the M ADCs needs to operate at a sampling rate of $f_s/M$. Once every M·T seconds, wherein T is an inverse of the sampling frequency, $f_s$, the demultiplexer couples an input of an ADC to the input signal. Each signal path containing an ADC can be referred to as a channel.

A multiplexer can be used to recombine outputs from the M ADCs back to a single output stream, a digital signal stream made up of digitized samples of the output signal. The output signal from the TI-ADC comprises a sequence of digitized samples, one every T seconds, with a number of bits in each digitized sample being determined by a conversion resolution of the M ADCs. The multiplexer changes a coupling between an output of one of the M ADCs to the output signal from the TI-ADC at a frequency that is substantially equal to the sampling rate.

By use of an M-channel time-interleaved ADC, the effective sampling rate is increased by a factor of M, but the resolution of the individual channel converters is unfortunately not maintained in the overall converter due to channel mismatch errors. To restore the resolution, it is therefore necessary to compensate for these errors. Up to a certain resolution, it is enough to compensate for static gain, and linear-phase (time-skew) errors (There also exist static offset mismatch errors but they are independent of signal transfer characteristics and are easy to compensate for). Several techniques for this purpose have been proposed over the last decades. However, to reach a very high resolution (more than some 12 bits) for high-speed conversion (above some 100 Megasamples/s), account has to be taken into that the different channel ADCs are essentially lowpass filters with different frequency responses, thus with different phase responses as well as magnitude responses. To reach a very high resolution, it is necessary to suppress these frequency response mismatch errors, not only the static gain and linear-phase parts which is enough for a first-order approximation of the channel frequency responses. Up to now, only a few papers have addressed the more general problem. Some of these papers, herein referred to as general prior art, and in their entirety incorporated into this description, are:

[1] T. Tsai, P. J. Hurst, and S. H. Lewis, "Bandwidth mismatch and its correction in time-interleaved analog-to-digital converters,", IEEE Trans. Circuits Syst. II, vol. 53, no. 10, pp. 1133-1137, October 2006.

[2] M. Seo, M. J. W. Rodwell, and U. Madhow, "Comprehensive digital correction of mismatch errors for a 400-Msamples/s 80-db SFDR time-interleaved analog-to-digital converter,", IEEE Trans. Microwave Theory Techniques, vol. 53, no. 3, pp. 1072-1082, March 2005.

[3] S. Mendel and C. Vogel, "A compensation method for magnitude response mismatches in two-channel time-interleaved analog-to-digital converters," in Proc. IEEE Int. Conf. Electronics, Circuits, Syst., Nice, France, December 2006.

[4] S. Mendel and C. Vogel, "On the compensation of magnitude response mismatches in M-channel time-interleaved ADCs.", in Proc. IEEE Int. Symp. Circuits, Syst., New Orleans, USA, May 2007.

The references [1]-[4] disclose use of compensation filters connected to the output of the channels of the TI-ADC. In reference [1], M synthesis filters are designed separately by use of a technique that approximates the desired filter frequency responses utilizing windowing techniques. Such design is known to result in suboptimum filters as they are based on truncation and weighting of ideal impulse responses instead of optimization. Reference [2] discloses a design with optimum filters based on least squares, wherein the filters are designed in terms of M synthesis filters, which are designed simultaneously by inverting one matrix of size M times the filter impulse response length.

A somewhat different compensation technique, that also utilizes separately designed filters, is disclosed in references [3] and [4], but the technique presented therein requires additional cosine and sine modulators which increases the implementation cost for the compensation system. Furthermore, references [3] and [4] only treat magnitude response mismatch errors of frequency response mismatch errors.

Other documents relating to methods for performing compensation of mismatch errors in time-interleaved ADC arrays are, e.g. US 2006/0279445 and US 2007/0069937. The method in the former of these cited documents suggests adjusting a delay imparted on a sampling clock by an adjustable delay in each channel. The second of the cited documents suggests the use of a reference ADC, by means of which a timing error is generated for use as a change of the phase of the sampling clock provided to the ADC and to estimate gain and DC offset errors for modifying values of reference voltages applied to the converter. The disclosures of said patent documents thus present solutions to problems as discussed in paragraph [0009].

In prior art technique used in the methods of references [1] to [4], the frequency mismatch errors in M-channel time-interleaved ADCs require online design of filters which may become quite cumbersome to implement.

Similar compensation systems composed of fixed filters and a few variable multipliers have been used in prior art but not for the problem considered in this presentation.

SUMMARY OF THE INVENTION

An object of the present invention is to introduce a compensation method for the frequency-response mismatch errors in M-channel time-interleaved ADCs. The compensation is done by means of a technique that makes use of a number of fixed filters, that approximate differentiators of different orders, and a few variable multipliers that directly correspond to parameters in polynomial models of the M channel frequency responses. Whenever the channel frequency responses change, which happens occasionally in a practical TI-ADC system, it suffices to alter the values of the variable multipliers. The invention further provides a compensated M-channel time-interleaved ADC based on and performing said method.

An advantage of the method and apparatus of the present invention is that it avoids on-line filter design and thus offers more economical implementation.

The problem to be solved by means of the present invention is discussed in the following, whereas the solution is presented more in detail in the embodiments of invention below.

The point of departure is a start with a continuous-time signal $x_a(t)$ that is bandlimited to $\omega_0 < \pi/T$. In this case, the Nyquist criterion for uniform sampling with a sampling frequency of 1/T without aliasing is fulfilled. That is, sampling according to $x(n)=x_a(nT)$ does not introduce aliasing which means that we have in the frequency domain $$X(e^{j\omega T}) = \frac{1}{T} X_a(j\omega), \qquad (1)$$

wherein $X(e^{j\omega T})$ and $X_a(j\omega)$ denote the Fourier transforms of the uniform-sampling sequence x(n) and the continuous-time signal $x_a(t)$, respectively. This means that $x_a(t)$ can be recovered from x(n).

In an M-channel time-interleaved ADC, without correction, we do not obtain the desired uniform sequence x(n) but instead another sequence, herein called v(n), through interleaving of $v_r(m)$, r=0,1, ..., M–1, according to $$v(n)=v_{<n>_M}(\lfloor n/M \rfloor), \qquad (2)$$

where $\lfloor x \rfloor$ denotes the integer part of x, $$<n>_M = n \bmod M, \qquad (3)$$

and $v_r(m)$ are the sequences generated by the M channel ADCs, see the figure explained below. Assuming that these ADCs are modeled as linear and time-invariant filters with frequency responses $Q_r(j\omega)$, the common input $x_a(t)$, and outputs $v_{ar}(t)$, $v_r(m)$ are given by $$v_r(m)=v_{ar}(mMT+rT). \qquad (4)$$

The problem to be solved can now be formulated as follows. Given the sequence v(n) in (2), form a new sequence y(n) that is an approximation of the sequence $x(n)=x_a(nT)$. A solution of this is presented more in detail in the embodiments of the invention.

DESCRIPTION OF EMBODIMENTS

Below the invention will be explained in greater detail by description of embodiments with reference to the accompanying drawing.

The proposed compensation method comprises four main steps as follows.

Step 1: Select a polynomial order P.
Step 2: Determine the M(P+1) parameters $\epsilon_{pr}$, p=0,1, ..., P, r=0,1, ..., M–1 in the Pth-order polynomial model of the M channel frequency responses $Q_r(j\omega)$, r=0,1, ..., M–1 given as $$Q_r(j\omega)=\epsilon_{0r}(1+\epsilon_{1r}\times(j\omega)+\epsilon_{2r}\times(j\omega)^2+\ldots+\epsilon_{Pr}\times(j\omega)^P). \qquad (5)$$

Figure 2:
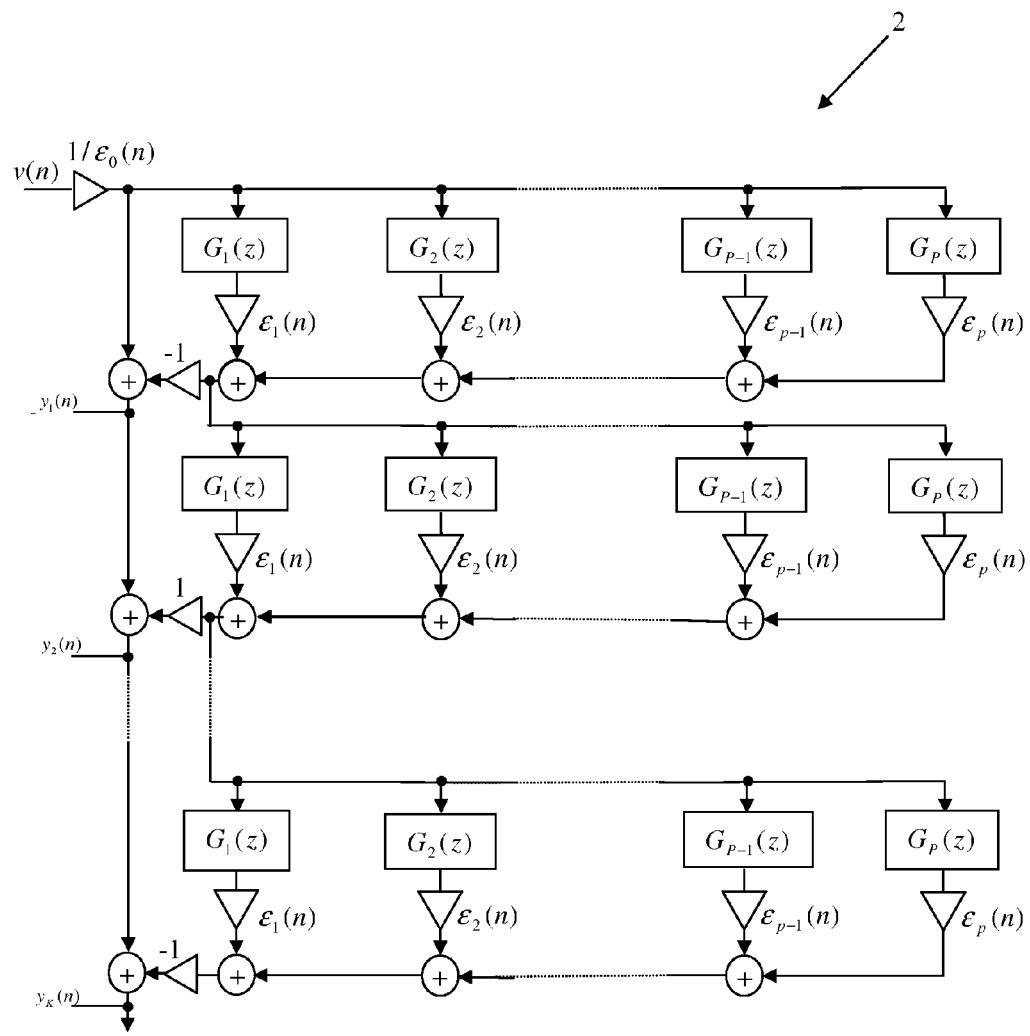
FIG. 2 is a schematic view of a filter structure used and applied as the filter indicated in FIG. 1.

Step 3: Choose an approximation-error order K.
Step 4: Compute the corrected output sequence $y_K(n)$ by applying the TI-ADC output v(n) to the filter structure depicted in FIG. 2, wherein the fixed filters $G_p(z)$, p=0,1, ..., P, approximate pth-order digital differentiators, respectively.

In Step 1, the polynomial order P is typically chosen as a small number, preferably either one or two, but the method works for any value of positive integers P.

In Step 2, the M(P+1) parameters $\epsilon_{pr}$ can be determined, e.g. by use of an input signal and modifying and extending the estimation method from two channels to M channels, e.g. as presented in the document: M. Seo, M. J. W. Rodwell, and U. Madhow, titled: "Generalized blind mismatch correction for two-channel time-interleaved A-to-D converters", in Proc. IEEE Int. Conf. Acoustics, Speech, Signal Processing, Hawaii, USA, April 2007.

Figure 1:
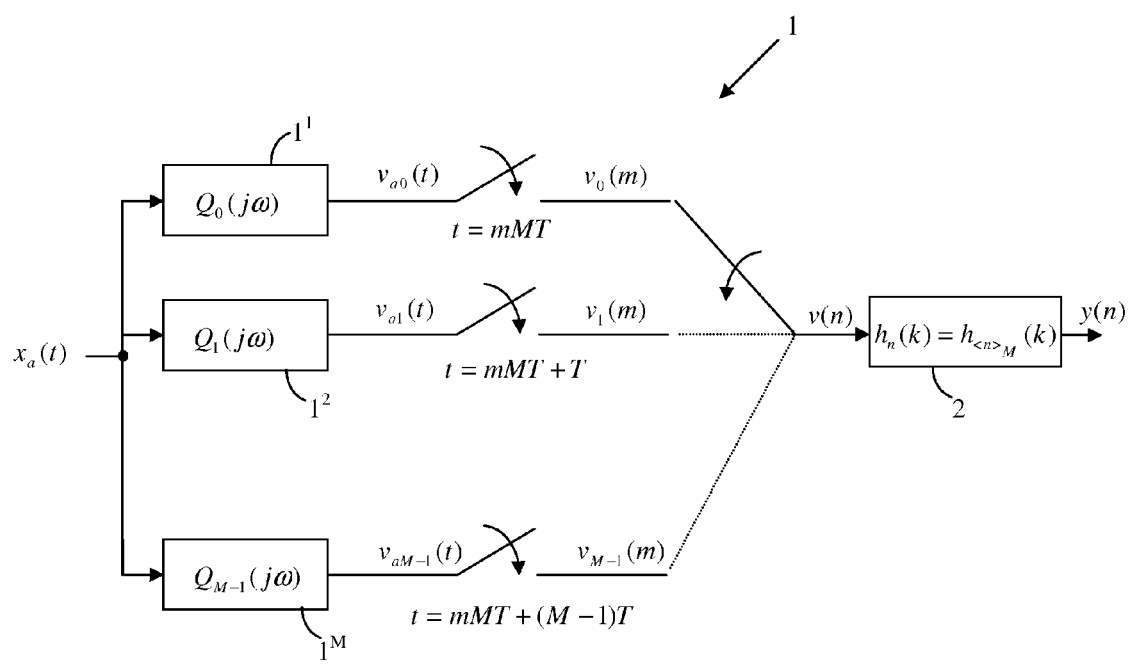
FIG. 1 shows an M-channel time-interleaved ADC 1 with different channel frequency responses $Q_r(j\omega)$, r=0, 1, ..., M–1, and an M-periodic time-varying compensation filter 2 with impulse response $h_n(k)=h_{<n>_M}(k)$.

In Step 3, an appropriate approximation-error order K must be selected. This may be done on-line with the aid of known input signals, but such an approach has difficulties in predicting the resulting approximation error for more general signals. Therefore, to circumvent this problem, this step is preferably done by utilizing the fact that the overall compensation architecture mathematically corresponds to an M-periodic time-varying filter that is described by M different impulse responses, say $h_r(n)$, as seen in FIG. 1. Each impulse response is a function of the digital differentiators $G_p(z)$ and the parameters $\epsilon_{pr}$. Therefore, for a given set of $G_p(Z)$ and $\epsilon_{pr}$, one can first derive all $h_r(k)$, r=0, 1, . . . , M−1 and then from these impulse responses evaluate the overall approximation error according to methods known in prior art, either in terms of a distortion and aliasing function, or in terms of M separate error functions. Moreover, when all $\epsilon_{pr}$ lie within a range of a minimum and a maximum value, which is the case in practice, the worst-case approximation error over all possible $\epsilon_{pr}$ values can be found for a given set of predesigned digital differentiators $G_p(Z)$.

However, instead of predesigning $G_p(Z)$ separately and then evaluating the overall approximation error, it should also be clear that the overall compensation system can be designed by optimizing $G_p(Z)$ simultaneously in a way that is similar to the design of other systems that utilize fixed filters and a few variable multipliers.

In Step 4, $\epsilon_p(n)$ are M-periodic sequences $\epsilon_p(n)=\epsilon_{p<n>_M}$.

In the previous section, the compensation system makes the overall output y(n) approximate the uniform-sequence $x(n)=x_a(nT)$. This requires that all channel frequency responses $Q_r(j\omega)$ are known. This can only be done using known input signals which is impractical. In practice, it is therefore preferable to determine the difference between the channel frequency responses and then match the channels. This introduces a small overall linear distortion which, fortunately, usually is allowed. In the proposed compensation system, we achieve this by first, in say a step 0, choosing a reference channel, say $r_{ref}$. Then, steps 2 and 4 are modified by setting the corresponding $\epsilon_{pr_{ref}}$ to $\epsilon_{0r_{ref}}=1$ and $\epsilon_{pr_{ref}}=0$ for p=1, 2, . . . P. In step 2 of the proposed four-step compensation method, the M−1 polynomial coefficients of the functions $Q_r(j\omega)/Q_{r_{ref}}(j\omega)$; r=0,1, . . . , M−1, r≠$r_{ref}$ must be determined. After the compensation in step 4, the overall ADC will then exhibit a frequency response $Q_{r\ ref}(j\omega)$.

The illustrated and described embodiments should only be referred to as an example. Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly stated here, that the converters described in each channel could be constructed as one unit or in separate units.

The invention claimed is:

1. A method for compensating frequency response mismatch errors in an M-channel interleaved analog-to-digital converter (TI-ADC) comprising M ADCs ($1^1$–$1^M$) in an array and a filter structure connected to the output of the TI-ADC, the method comprising:
   selecting M frequency functions of order P,
   determining M (P+1) coefficients $\epsilon_{pr}$; p=0,1, . . . , P; r=0,1, . . . M−1 of said frequency functions,
   choosing an approximation order K, and
   computing a compensated output sequence by applying the TI-ADC output to said filter structure containing multipliers with said coefficients $\epsilon_{pr}$ and M fixed filters $G_p(z)$, p=1,2, . . . , M.

2. The method according to claim 1, further comprising:
   denoting the channel responses by $Q_r(j\omega)$,
   determining the polynomial models of the frequency functions of the channel responses $Q_r(j\omega)$, r=0,1, . . . , M−1 given as $$Q_r(j\omega)=\epsilon_{0r}(1+\epsilon_{1r}\times(j\omega)+\epsilon_{2r}\times(j\omega)^2+\ldots+\epsilon_{Pr}\times(j\omega)^P).$$

3. The method according to claim 1, further comprising:
   choosing a reference channel $r_{ref}$,
   denoting the channel responses by $Q_r(j\omega)$,
   determining polynomial models of the frequency functions $Q_r(j\omega)/Q_{r_{ref}}(j\omega)$, r=0,1, . . . , M−1 given as:

$$Q_r(j\omega)/Q_{r_{ref}}(j\omega)=\epsilon_{0r}(1+\epsilon_{1r}\times(j\omega)+\epsilon_{2r}\times(j\omega)^2+\ldots+\epsilon_{Pr}\times(j\omega)^P),$$

wherein p=0,1, . . . , P; r=0,1, . . . , M−1; r≠$r_{ref}$ and $\epsilon_{pr_{ref}}$ is set to $\epsilon_{0r_{ref}}=1$ and further $\epsilon_{pr_{ref}}=0$ for p=1,2, . . . , P.

4. The method according to claim 1, further comprising: approximating pth order differentiators $G_p(z)$.

5. The method according to claim 1, further comprising: optimizing $G_p(z)$ simultaneously.

6. A compensated analog-to-digital time-interleaved converter, comprising:
   a number of M channels,
   each channel including an ADC ($1^1$–$1^M$), and
   a filter structure (2) connected to the output of the M channel TI-ADC,
   wherein the converter is configured to carry out a method for compensating frequency response mismatch errors in the converter, the method comprising
   selecting M frequency functions of order P,
   determining M (P+1) coefficients $\epsilon_{pr}$; p=0,1, . . . , P; r= 0,1, . . . M−1 of said frequency functions,
   choosing an approximation order K, and
   computing a compensated output sequence by applying the TI-ADC output to said filter structure containing multipliers with said coefficients $\epsilon_{pr}$ and M fixed filters $G_p(z)$, p=1,2, . . . , M.

7. The compensated analog-to-digital converter according to claim 6, wherein said filter structure comprises a number of fixed filters $G_p(z)$ and variable multipliers.

8. The compensated analog-to-digital converter according to claim 6, wherein the filter structure has $G_p(z)$ filters corresponding to pth order differentiators.

9. The compensated analog-to-digital converter according to claim 6, wherein said filter structure has variable multipliers corresponding to the coefficients $\epsilon_{pr}$.

* * * * *